United States Patent
Hong (10) Patent No.: US 9,165,808 B2
(45) Date of Patent: Oct. 20, 2015

(54) METAL ORGANIC CHEMICAL VAPOR DEPOSITION DEVICE AND TEMPERATURE CONTROL METHOD THEREFOR

(75) Inventor: Sung Jae Hong, Gyeonggi-do (KR)

(73) Assignee: LIGADP CO., LTD., Gyeonggi-do (KR)

( * ) Notice: Subject to any disclaimer, the term of this patent is extended or adjusted under 35 U.S.C. 154(b) by 587 days.

(21) Appl. No.: 13/503,787

(22) PCT Filed: Oct. 28, 2009

(86) PCT No.: PCT/KR2009/006260
§ 371 (c)(1),
(2), (4) Date: Apr. 24, 2012

(87) PCT Pub. No.: WO2011/052817
PCT Pub. Date: May 5, 2011

(65) Prior Publication Data
US 2012/0221138 A1    Aug. 30, 2012

(51) Int. Cl.
*G06F 19/00* (2011.01)
*G05D 5/00* (2006.01)
(Continued)

(52) U.S. Cl.
CPC .......... *H01L 21/67248* (2013.01); *C23C 16/46* (2013.01); *C23C 16/52* (2013.01);
(Continued)

(58) Field of Classification Search
CPC ............... H01L 21/67248; H01L 21/67098; H01L 27/1296; H01L 21/68764; H01L 21/68771; G05B 19/41785; G05B 2219/45031; C23C 16/46; C23C 16/52
USPC ........... 700/108, 299, 121; 118/725, 712, 667
See application file for complete search history.

(56) References Cited

U.S. PATENT DOCUMENTS 6,031,211 A * 2/2000 Mailho et al. ................ 219/486
6,492,625 B1 * 12/2002 Boguslavskiy et al. ....... 219/486
(Continued)

FOREIGN PATENT DOCUMENTS

CN     1607989 A     4/2005
CN     101495847 A   7/2009
(Continued)

OTHER PUBLICATIONS

Korean Patent Abstracts, Publication No. 10-2009-0058769, dated Jun. 10, 2009, 2 pages.
(Continued)

*Primary Examiner* — Kenneth M Lo
*Assistant Examiner* — Jason Lin
(74) *Attorney, Agent, or Firm* — Osha • Liang LLP (57) ABSTRACT

The present invention provides a metal organic chemical vapor deposition device and a temperature control method therefor. The device comprises: a chamber; a susceptor which is installed inside the chamber to allow rotation therein, wherein at least one substrate is settled thereon; a plurality of heaters which heat the susceptor, wherein the temperature is independently controlled; a gas sprayer which is positioned in the upper part of the susceptor, and sprays gases of group III and V toward the susceptor; a plurality of temperature detection sensors which are positioned in the upper part of the susceptor, and measure the temperature of heating regions heated by each heater; and a controller which retains temperature setting values necessary for the heating regions, and controls the temperature of the heating regions by comparing sensing temperature values detected by each temperature detection sensor with the setting values necessary for the heating regions. According to the present invention, the metal organic chemical vapor deposition device and the temperature control method therefor can uniformly apply necessary temperature ramping to the entire substrates during process by effectively adjusting the temperature conditions essential for every epitaxial process in the metal organic chemical vapor deposition device, which carries out the process by changing the temperature up to 1200° C. from room temperature. Therefore, the invention improves process efficiency and deposition uniformity.

18 Claims, 7 Drawing Sheets

(51) Int. Cl.
*G05D 11/00* (2006.01)
*C23C 16/00* (2006.01)
*C23C 16/50* (2006.01)
*H01L 21/67* (2006.01)
*G05B 19/418* (2006.01)
*C23C 16/46* (2006.01)
*C23C 16/52* (2006.01)
*H01L 21/687* (2006.01)

(52) U.S. Cl.
CPC .... *G05B19/41875* (2013.01); *H01L 21/68764* (2013.01); *H01L 21/68771* (2013.01); *G05B 2219/45031* (2013.01)

(56) References Cited

U.S. PATENT DOCUMENTS

| | | | |
|---|---|---|---|
| 8,014,895 B2* | 9/2011 | Iwanaga et al. | 700/210 |
| 2003/0080109 A1 | 5/2003 | Choi et al. | |
| 2003/0209327 A1* | 11/2003 | Kuznetsov et al. | 156/345.52 |
| 2003/0209372 A1* | 11/2003 | Campbell et al. | 180/9.44 |
| 2003/0233768 A1* | 12/2003 | Kaeppeler | 34/560 |
| 2007/0238202 A1* | 10/2007 | Ranish et al. | 438/14 |
| 2009/0060686 A1* | 3/2009 | Morita et al. | 414/147 |
| 2009/0183677 A1* | 7/2009 | Tian et al. | 118/667 |
| 2009/0194024 A1* | 8/2009 | Burrows et al. | 118/712 |
| 2009/0254226 A1 | 10/2009 | Iwanaga et al. | |
| 2009/0298300 A1* | 12/2009 | Ranish et al. | 438/795 |
| 2010/0054720 A1* | 3/2010 | Hunter et al. | 392/416 |

FOREIGN PATENT DOCUMENTS

| | | |
|---|---|---|
| JP | 2006-185959 A | 7/2006 |
| KR | 10-0443122 B1 | 8/2004 |
| KR | 10-2009-0080897 A | 7/2009 |
| KR | 10-0966370 | 6/2010 |
| TW | 200937151 A | 9/2009 |

OTHER PUBLICATIONS

Korean Patent Abstracts, Publication No. 10-2003-0032734, dated Apr. 26, 2003, 2 pages (corresponds to KR 10-0443122 B2 cited herein).
Korean Patent Abstracts, Publication No. 10-2009-0080897, dated Apr. 26, 2003, 2 pages.
International Search Report issued in PCT/KR2009/006260, mailed Jul. 27, 2010, with translation, 4 pages.
Extended European Search Report issued Oct. 4, 2013 in corresponding European application No. 09860888.0 (8 pages).
Office Action issued Mar. 20, 2014 in corresponding Chinese application No. 200980162274.8 (12 pages).
Second Office Action issued Nov. 3, 2014 in corresponding Chinese application No. 200980162274.8 (5 pages).

* cited by examiner

METAL ORGANIC CHEMICAL VAPOR DEPOSITION DEVICE AND TEMPERATURE CONTROL METHOD THEREFOR

BACKGROUND OF THE INVENTION

1. Field of the Invention

The present invention relates to a metal organic chemical vapor deposition device and a temperature control method therefore and, more particularly, to a metal organic chemical vapor deposition device and a temperature control method therefor, which are capable of controlling a temperature of a plurality of divided heating regions.

2. Background of the Related Art

A nitride material has been most well known as materials for fabricating light-emitting devices. The light-emitting device using the nitride material chiefly has a structure in which a buffer layer made of GaN crystals, an n type doping layer made of n type GaN crystals, an active layer made of InGaN, and a p type doping layer made of p type GaN are sequentially stacked over a substrate, such as a sapphire. Furthermore, the layers are sequentially stacked in one metal organic chemical vapor deposition device chamber.

However, temperature conditions for growing each of the layers are different, and the temperature conditions must be effectively controlled whenever each layer is grown in order to satisfy the temperature conditions. Moreover, if a plurality of wafers is seated on a susceptor and a process is performed, temperature uniformity in the entire area of the susceptor has a great effect on process efficiency. For example, if a temperature for forming an n type doping layer is 1200° C., a temperature for forming an active layer may be 700° C. to 900° C. Furthermore, in case of multiple active layers, a process temperature is repeatedly changed in 700° C. and 900° C.

SUMMARY OF THE INVENTION

Temperature control in a metal organic chemical vapor deposition device is the most important technology for effectively performing the process and obtaining a high quality light-emitting device. If this temperature control is effectively performed, a high efficiency light-emitting device can be obtained. Accordingly, an object of the present invention is to perform temperature control of a metal organic chemical vapor deposition device more effectively.

The present invention provides a metal organic chemical vapor deposition device and a temperature control method therefor, wherein a temperature of a susceptor can be effectively controlled in each epitaxial process in the metal organic chemical vapor deposition device.

An metal organic chemical vapor deposition device according to the present invention includes a chamber; susceptors rotatably installed within the chamber and configured to have at least one substrate seated therein; a plurality of heaters configured to heat the susceptors and to have their temperatures independently controlled; gas sprayers placed over the susceptors and configured to spray group III gas and group V gas toward the susceptors; a plurality of temperature detection sensors placed on one side of the susceptors and configured to measure temperatures of heating regions heated by the respective heaters; and a controller configured to store temperature setting values necessary for the respective heating regions and to control the temperatures of the heating regions by comparing the detected temperature values, detected by the respective temperature detection sensors, with the respective temperature setting values necessary for the heating regions.

The heating regions may include individual heaters individually controlled, the temperature controller may include individual controllers for controlling the respective heaters, and individual power sources for independently supplying electric power to the respective heaters may be connected to the respective heaters.

The temperature controller may include individual controllers for controlling the respective heating regions, store a temperature setting value for any one of the heating regions as a representative temperature setting value, and control the temperatures of the heating regions based on the representative temperature setting value.

The temperature controller may control a temperature of a representative heating region, selected from among the heating regions, based on the representative temperature setting value and control the temperatures of the remaining heating regions other than the representative heating region based on the detected temperature value detected by a temperature detection sensor for detecting the temperature of the representative heating region, from among the temperature detection sensors.

The temperature controller may measure a temperature ramping tendency detected by the representative heating region and perform control so that the remaining heating regions other than the representative heating region comply with the temperature ramping tendency of the representative heating region.

The temperature ramping tendency may be a temperature ramping speed of the representative heating region.

The temperature controller may store individual temperature setting values necessary for the respective heating regions and control the temperatures of the respective heating regions using the individual temperature setting values.

The temperature controller may measure a temperature ramping tendency detected in each of the heating regions and perform control so that the heating regions have the temperature ramping tendency.

The temperature ramping tendency may be the temperature ramping speed of each of the heating regions.

The temperature ramping tendency may be a temperature variation in each of the temperature setting values of the heating regions.

The temperature controller may calculate the mean value of temperatures detected while the susceptors are rotated by specific number of times and control the temperatures of the heating regions by comparing the mean value with each of the temperature setting values.

The temperatures of the heating regions detected by the temperature detection sensors may be temperatures for the susceptors.

The temperatures of the heating regions detected by the temperature detection sensors may be a temperature for the substrate.

The temperatures of the heating regions detected by the temperature detection sensors may be temperatures for the susceptors and the substrate.

A method of controlling temperatures of a plurality of heating regions for a metal organic chemical vapor deposition device according to the present invention includes detecting the temperatures of the heating regions by using respective temperature detection sensors; and comparing temperature values, detected by the temperature detection sensors, with respective temperature setting values and controlling the heating regions based on the temperature setting values by using a temperature controller for storing the temperature setting values necessary for the respective heating regions.

The heating regions may include individual heaters individually controlled, the temperature controller may include individual controllers for controlling the respective heaters, and individual power sources for independently supplying electric power to the respective heaters may be connected to the respective heaters.

The temperature controller may include individual controllers for controlling the respective heating regions, store a temperature setting value for any one of the heating regions as a representative temperature setting value, and control the temperatures of the heating regions based on the representative temperature setting value.

The temperature controller may control a temperature of a representative heating region, selected from among the heating regions, based on the representative temperature setting value and control the temperatures of the remaining heating regions other than the representative heating region based on the detected temperature value detected by a temperature detection sensor for detecting the temperature of the representative heating region, from among the temperature detection sensors.

The temperature controller may measure a temperature ramping tendency detected by the representative heating region and perform control so that the remaining heating regions other than the representative heating region comply with the temperature ramping tendency of the representative heating region.

The temperature ramping tendency may be a temperature ramping speed of the representative heating region.

The temperature controller may store individual temperature setting values necessary for the respective heating regions and control the temperatures of the respective heating regions using the individual temperature setting values.

The temperature controller may measure a temperature ramping tendency detected in each of the heating regions and perform control so that the heating regions have the temperature ramping tendency.

The temperature ramping tendency may be the temperature ramping speed of each of the heating regions.

The temperature ramping tendency may be a temperature variation in each of the temperature setting values of the heating regions.

The temperature controller may calculate the mean value of temperatures detected while the susceptors are rotated by specific number of times and control the temperatures of the heating regions by comparing the mean value with each of the temperature setting values.

The temperatures of the heating regions detected by the temperature detection sensors may be temperatures for the susceptors.

The temperatures of the heating regions detected by the temperature detection sensors may be a temperature for the substrate.

The temperatures of the heating regions detected by the temperature detection sensors may be temperatures for the susceptors and the substrate.

DETAILED DESCRIPTION OF EMBODIMENTS

A metal organic chemical vapor deposition device and temperature control methods therefor according to the embodiment are described methods.

Figure 1:
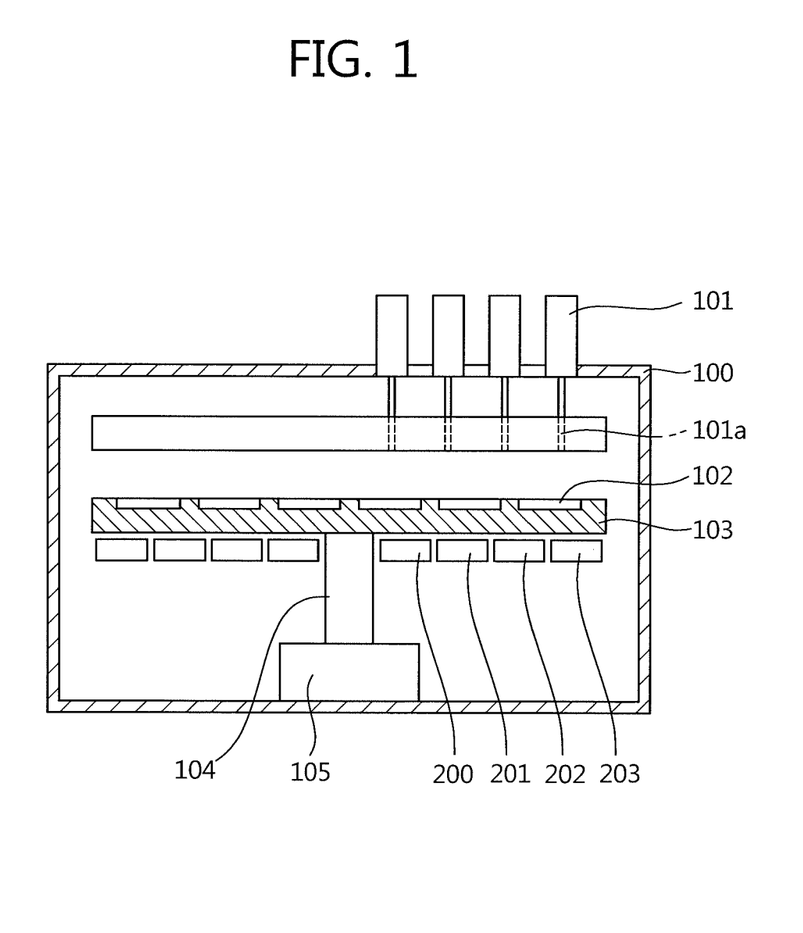
FIG. 1 is a diagram showing an embodiment of a metal organic chemical vapor deposition device.

FIG. 1 is a diagram showing an embodiment of the metal organic chemical vapor deposition device.

As shown in FIG. 1, the metal organic chemical vapor deposition device includes a reaction chamber 100 and gas sprayers 101 for spraying a process gas from an upper part to a lower part within the reaction chamber 100. The gas sprayers 101 may include showerheads, nozzles, etc. for spraying group III gas and group V gas. Furthermore, a plurality of viewpoints 101a having their bottoms opened is formed in the respective gas sprayers so that temperature detection sensors to be described later can detect temperature.

Furthermore, subsectors 102 in which a substrate 103, such as at least one sheet of a sapphire substrate 103, is seated is installed under the gas sprayers 101. In FIG. 1, the substrate 103 may be a satellite susceptor which has the at least one substrate 103 seated therein and which may be deviated from the susceptors 102 and drawn externally.

The satellite susceptor may be configured to revolve around the rotating shaft 104 of the susceptors 102 by means of the rotation of the susceptors 102 and also to revolute and rotate by rotation itself. To this end, a motor 105 is installed under the susceptor 102, and the center of the susceptors 102 is coupled to the rotating shaft 104 of the motor 105. Furthermore, for the rotation of the satellite susceptor, the satellite susceptor may be configured to be rotated by air pressure or a mechanical operation, although not shown.

Furthermore, a plurality of heaters 200, 201, 202, and 203 for heating the susceptors 102 to a high temperature is installed under the susceptors 102. The heater may be formed of a tungsten heater, a ceramic heater, an RF heater or the like. The heaters include a first heater 200, a second heater 201, a third heater 202, and a fourth heater 203. The first heater 200 heats a portion near the center which is the most inner side of the susceptors 102.

In the present embodiment, a region heated by the first heater 200 is called a first heating region. Furthermore, the second heater 201, the third heater 202, and the fourth heater 203 are sequentially placed outside the first heater 200, and regions corresponding to the second heater 201, the third heater 202, and the fourth heater 203 are sequentially divided into a second heating region, a third heating region, and a fourth heating region. Furthermore, the first heater 200, the second heater 201, the third heater 202, and the fourth heater 203 include a first temperature detection sensor 240 for detecting a temperature of the first heating region heated by the first heater 200, a second temperature detection sensor 241 for detecting a temperature of the second heating region, a third temperature detection sensor 242 for detecting a temperature of the third heating region, and a fourth temperature detection sensor 243 for detecting a temperature of the fourth heating region. The heating regions detected by the respective temperature detection sensors 240, 241, 242, and 243 may be the positions of the susceptors 102, may become regions where temperatures of the substrates 103 (i.e., wafers) are detected, or may be regions where temperatures of both the substrate 103 and the wafer are detected while the susceptors 102 are rotated.

Meanwhile, in another embodiment, the temperature detection sensors may be placed under the susceptors 102. Here, the temperature detection sensor may be a thermo couple or a pyrometer. If the pyrometer is used, the viewpoints may be formed under the heaters, such as RF heaters.

Figure 2:
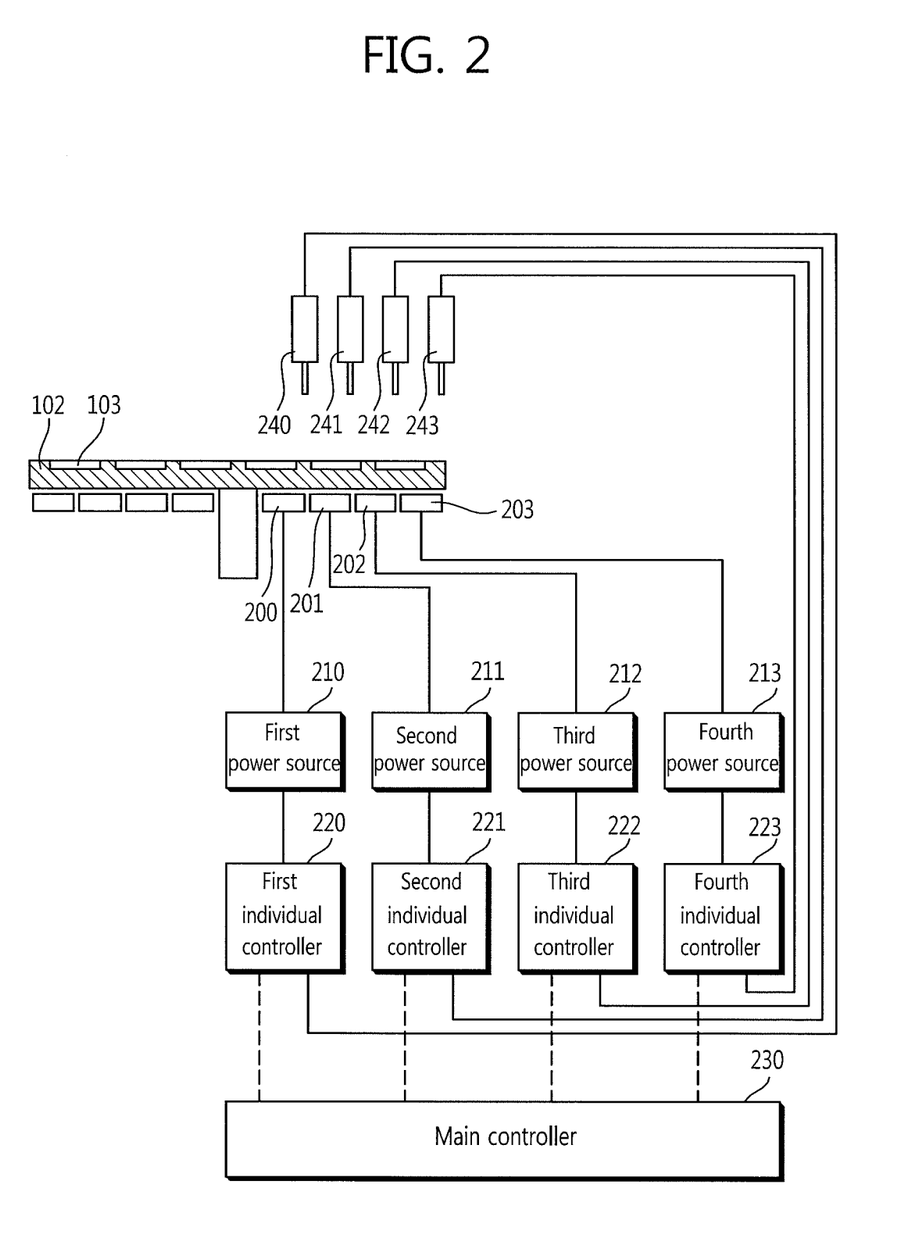
FIG. 2 is a diagram showing a first embodiment of the temperature control construction of the metal organic chemical vapor deposition device.

FIG. 2 is a diagram showing a first embodiment of the temperature control construction of the metal organic chemical vapor deposition device.

As shown in FIG. 2, in the temperature control construction of the metal organic chemical vapor deposition device, power sources and controllers are connected to the respective heaters. First, a first power source 210 for supplying electric power to the first heater 200 is connected to the first heater 200. The first power source 210 is equipped with a first individual controller 220 for controlling the first power source 210. Furthermore, a second power source 211 for supplying electric power to the second heater 201 is connected to the second heater 201. The second power source 211 is equipped with a second individual controller 221 for controlling the second power source 211. Furthermore, a third power source 212 for supplying electric power to the third heater 202 is connected to the third heater 202. The third power source 212 is equipped with a third individual controller 222 for controlling the third power source 212. Furthermore, a fourth power source 213 for supplying electric power to the fourth heater 203 is connected to the fourth heater 203. The fourth power source 213 is equipped with a fourth individual controller 223 for controlling the fourth power source 213.

Furthermore, a main controller 230 for controlling the first, the second, the third, and the fourth individual controllers 220, 221, 222, and 223 is also provided. Furthermore, each of the individual controllers 220, 221, 222, and 223 calculates a mean value of temperatures detected while the susceptors 102 are rotated by one or more times and determines the mean value as a detected temperature value. That is, temperature control for each heating region may be performed by comparing a temperature mean value and a temperature setting value.

Figure 3:
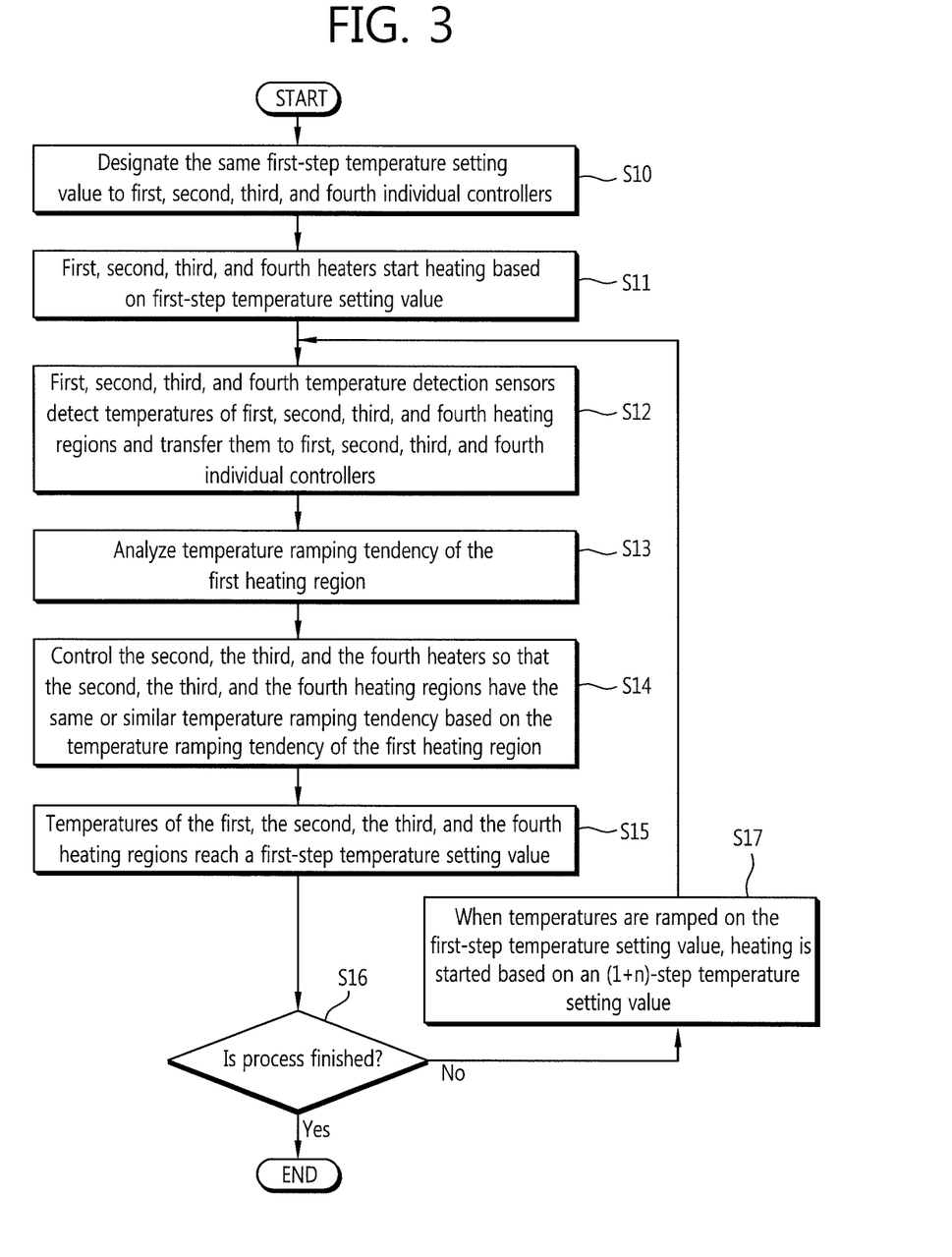
FIG. 3 is a flowchart illustrating a first control method using the temperature control construction of the metal organic chemical vapor deposition device according to the embodiment of FIG. 2.

FIG. 3 is a flowchart illustrating a first control method using the temperature control construction of the metal organic chemical vapor deposition device according to the embodiment of FIG. 2.

As shown in FIG. 3, the same first-step temperature setting value may be designated to the first, the second, the third, and the fourth individual controllers 220, 221, 222, and 223 (S10). The temperature setting value may be a ramping temperature which is a target in each region. The reason why the ramping temperature is set as the same temperature setting value (or setting point) is to uniformly deposit a metal organic substance all over the substrate 103 by maintaining all the susceptors 102 at the same temperature.

For example, in an epitaxial process for fabricating a Light-Emitting Device (LED), assuming that 1,200° C. that is a temperature for heat treatment and cleaning the substrate 103 under a first hydrogen atmosphere on the substrate 103 is a target temperature, the target temperature detected by the temperature detection sensor may become the temperature setting value.

Furthermore, if the same first-step temperature setting value is designated to the individual controllers 220, 221, 222, and 223, the first, the second, the third, and the fourth individual controllers 220, 221, 222, and 223 apply the same temperature setting value to the first, the second, the third, and the fourth power sources 210, 211, 212, and 213. Accordingly, the first, the second, the third, and the fourth heaters 200, 201, 202, and 203 heat the respective susceptors 102 to the same temperature setting value (S11). Here, the susceptor 102 is rotated at a specific rotating speed.

Meanwhile, the first, the second, the third, and the fourth temperature detection sensors 240, 241, 242, and 243 detect temperatures for the susceptors 102 in the respective heating regions and transfer the detected temperature values to the individual controllers 220, 221, 222, and 223 (S12). Furthermore, when the detected temperature reaches the first-step temperature setting value, each of the heaters 200, 201, 202, and 203 maintains a relevant temperature within an acceptable error range of the first-step temperature setting value. The acceptable error range may be within 3% of a setting temperature.

While the temperature is ramped on the first-step temperature setting value, the temperature detection sensor 240, 241, 242, and 243 analyzes and determines a temperature ramping tendency (i.e., a temperature rise tendency or a temperature fall tendency) of the first heating region (S13). The temperature ramping tendency may be a temperature ramping time versus a temperature value (i.e., a temperature rise speed or a temperature fall speed).

The temperature ramping tendency is related to deposition uniformity and deposition quality for a wafer in the epitaxial process. If the temperature ramping tendency is different in each of heating regions, it is difficult to obtain the result of a high quality epitaxial process because deposition quality is deteriorated. Accordingly, if the same or most similar temperature ramping tendency is maintained in the heating regions, the improvement of the epitaxial quality may be expected. Control of the temperature ramping tendency is described in more detail with reference to FIG. 5.

Temperature ramping is performed by adjusting the temperature ramping tendency so that the first, the second, the third, and the fourth heating regions have the same or most similar temperature ramping tendency (S14). If each of temperatures of the first, the second, the third, and the fourth heating regions reaches the temperature setting value, a desired epitaxial process is performed (S15).

It is then determined whether the relevant process has been completed (S16). If, as a result of the determination, the main controller 230 determines that a next process needs to be performed, a temperature setting value different from the first-step temperature setting value is inputted (S17). For example, the main controller 230 may provide a second-step temperature setting value (i.e., an (1+n)-step, wherein n is a natural number) to the first, the second, the third, and the fourth individual controllers 220, 221, 222, and 223 as the temperature setting value. Accordingly, the first, the second, the third, and the fourth individual controllers 220, 221, 222, and 223 perform control so that temperature ramping is performed based on a next-step temperature setting value in the heaters 200, 201, 202, and 203 through the power sources 210, 211, 212, and 213. Likewise, the temperature ramping tendency is maintained.

Furthermore, temperature setting for a plurality of different temperature setting values may be applied when a plurality of epitaxial processes with different conditions is performed in one reaction chamber 100. Since one epitaxial process may be performed in one reaction chamber 100, temperature setting may be modified in various ways depending on process operating conditions of the reaction chamber 100.

Meanwhile, in another embodiment, temperature ramping may be performed by inputting different and unique temperature setting values to the heaters 200, 201, 202, and 203. In this case, if a large number of the substrates 103 are seated in the large-sized susceptors 102, temperature ramping may be performed when it is difficult to control a temperature over a very wide area using the same temperature setting value or may be performed when a process target has a different temperature ramping value in each heating region for epitaxial uniformity, but process efficiency is good. In yet another example, temperature ramping may be performed when temperature ramping needs to be controlled more actively, such as the case in which a different process is required in each position on the susceptor 102.

Figure 4:
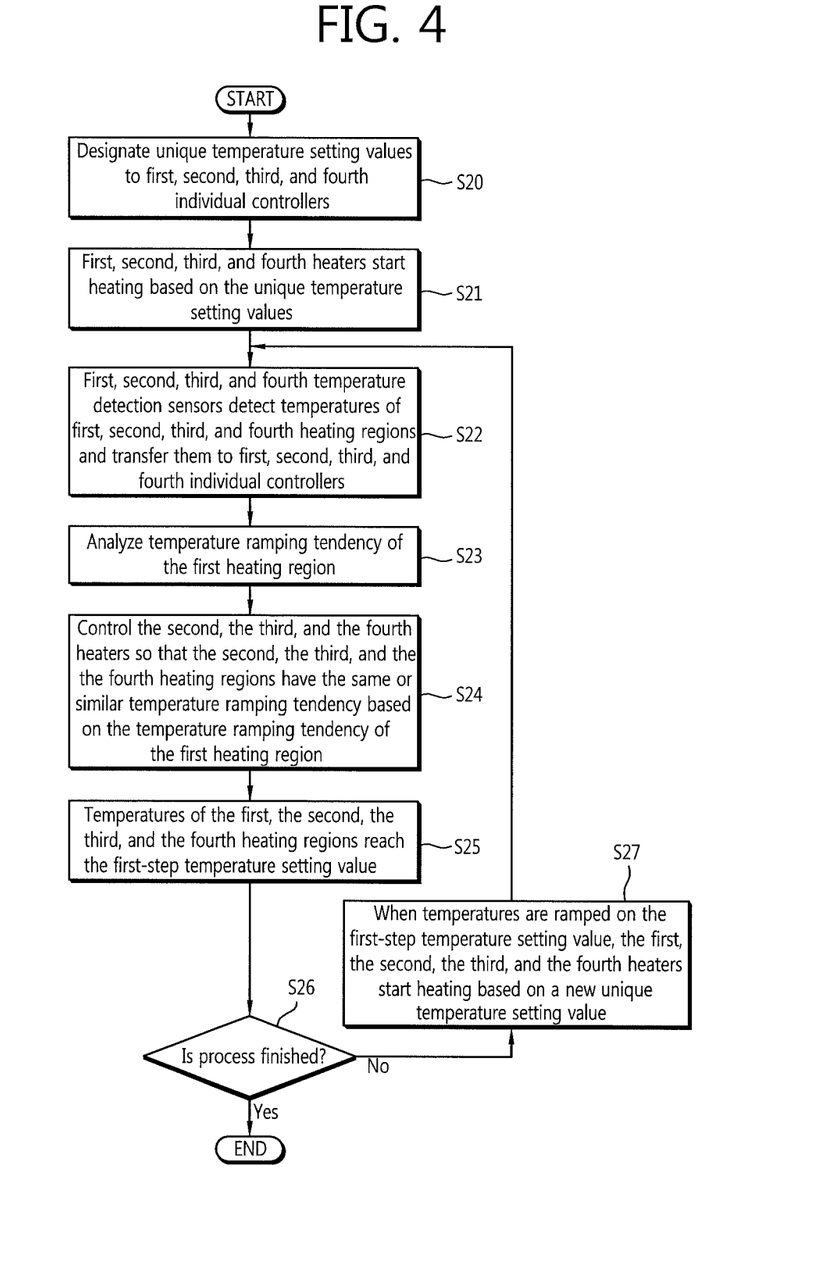
FIG. 4 is a flowchart illustrating a second control method using the temperature control construction of the metal organic chemical vapor deposition device according to the embodiment of FIG. 2.

A method for the embodiment is shown in FIG. 4. FIG. 4 is a flowchart illustrating a second control method using the temperature control construction of the metal organic chemical vapor deposition device according to the embodiment of FIG. 2.

As shown in FIG. 4, the main controller 230 designates unique temperature setting values to the first, the second, the third, and the fourth individual controllers 220, 221, 222, and 223 (S20). Each of the unique temperature setting values may be a ramping temperature which is independently a target in each heating region.

When the unique temperature setting values are designated to the individual controllers 220, 221, 222, and 223, the first, the second, the third, and the fourth individual controllers 220, 221, 222, and 223 supply unique temperature setting values to the first, the second, the third, and the fourth power sources 210, 211, 212, and 213. Accordingly, the first, the second, the third, and the fourth heaters 200, 201, 202, and 203 heat the respective susceptors 102 based on the unique temperature setting values (S21). Here, the susceptors 102 are rotated at a specific rotating speed.

Next, the first, the second, the third, and the fourth temperature detection sensors 240, 241, 242, and 243 detect temperatures of the respective heating regions and transfer the detected temperatures to the individual controllers 220, 221, 222, and 223 (S22). When the detected temperatures reach the respective unique temperature setting values, each of the heaters 200, 201, 202, and 203 maintains the relevant temperature within an acceptable error range of the preset unique temperature setting value. The acceptable error range may be within 3% of the setting temperature.

While the temperature is ramped on the unique temperature setting value, the first temperature detection sensor 240 determines a temperature ramping tendency of the first heating region (a temperature rise tendency or a temperature fall tendency). The characteristic of the temperature ramping tendency is the same as that of the first method.

When the temperature of each of the first, second, third, and the fourth heating regions reaches the preset unique temperature setting value in the state in which the first, the second, the third, and the fourth heating regions are adjusted to have the same or very similar temperature ramping tendency, a desired epitaxial process is performed (S24, S25).

It is then determined whether the relevant process has been completed (S26). If, as a result of the determination, the main controller 230 determines that a next process needs to be performed, the main controller 230 input second new and unique temperature setting values different from the first unique temperature setting values as temperature setting values (S27). Accordingly, the first, the second, the third, and the fourth individual controllers 220, 221, 222, and 223 perform control so that temperature ramping is performed based on the unique temperature setting values of a next step in the heaters 200, 201, 202, and 203 through the respective power sources. Likewise, the temperature ramping tendency is maintained.

Figure 5:
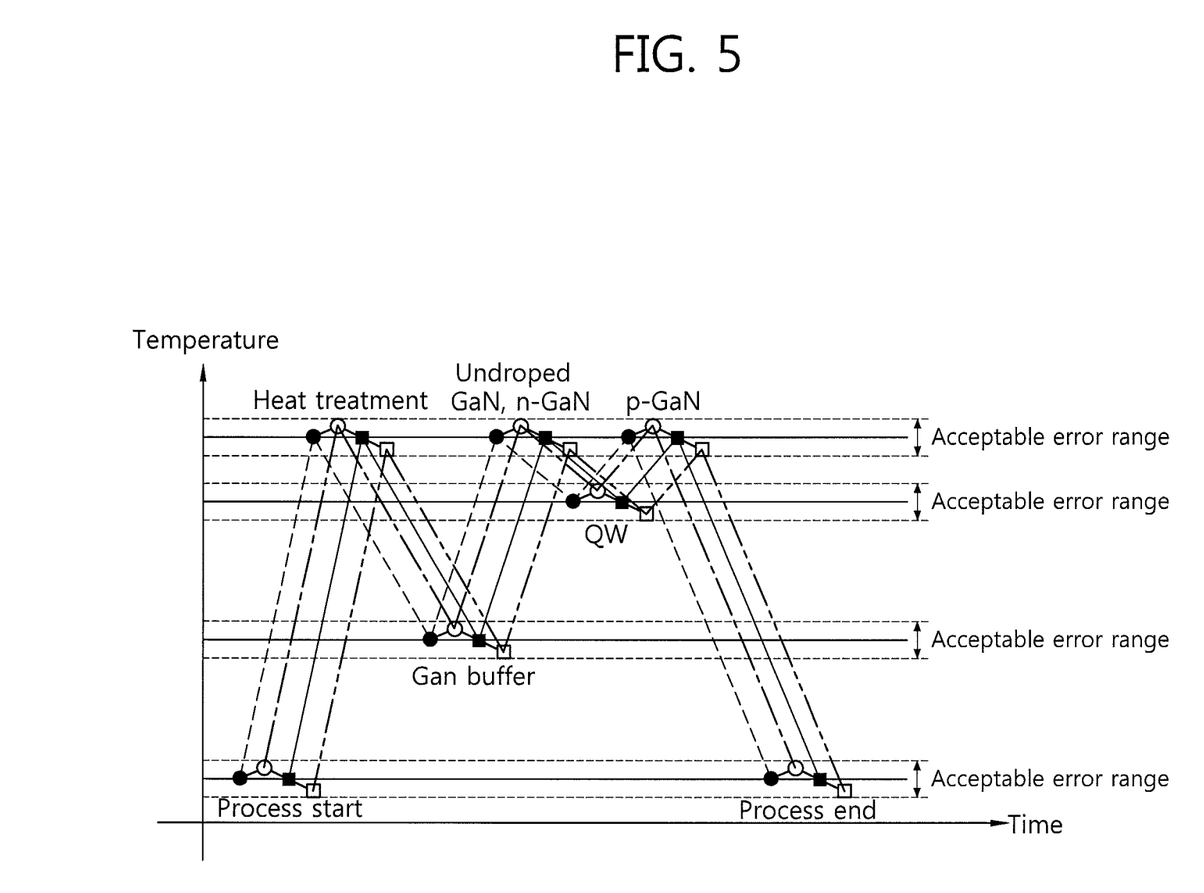
FIG. 5 is a graph illustrating a temperature ramping tendency in each temperature control region.

Meanwhile, FIG. 5 is a graph illustrating a temperature ramping tendency in temperature control regions. In FIG. 5, a process of maintaining a temperature ramping tendency in each heater or region is described by taking the epitaxial process of an LED as an example.

As shown in FIG. 5, in order to perform the epitaxial process, the plurality of substrates 103, such as sapphires, is seated on the susceptors 102 within the reaction chamber 100. Next, the inside of the reaction chamber 100 is blocked from the outside, and preparations for starting the process are made. During the preparation time for starting the process, the first, the second, the third, and the fourth temperature detection sensors 240, 241, 242, and 243 measure temperatures of the relevant heating regions and transfer the detected results to the individual controllers 220, 221, 222, and 223.

The process is performed according to a necessary process sequence. The first process is a cleaning process for cleaning the substrates 103 through heat treatment. For the cleaning process, temperature setting values are set to 1000° C. to 1200° C., and the inside of the reaction chamber 100 becomes a hydrogen atmosphere.

If the temperature setting values are identically set, the main controller 230 transfer the same temperature setting value to the first, the second, the third, and the fourth individual controllers 220, 221, 222, and 223. If different temperature setting values for process uniformity are set in the heating regions, the main controller 230 transfer unique temperature setting value to the individual controllers 220, 221, 222, and 223. In either case, a temperature required in an heat treatment process is 1000° C. to 1200° C. within an acceptable error range.

If the temperature setting values are set as described above, the heaters perform temperature ramping based on the temperature setting values. In the heat treatment process, temperature ramping conditions are to raise a temperature up to the temperature setting values. At this time, a temperature ramping tendency (i.e., a temperature-rise speed) in the first heating region is detected. In other words, the temperature-rise speed is detected based on a temperature for the consumption time, and each of temperature-rise speeds in the second, third, and fourth heating regions are then compared with the temperature-rise speed in the first heating region. If heating regions having temperature-rise speeds different from the temperature-rise speed in the first heating region are detected, the individual controllers 220, 221, 222, and 223 for controlling the respective heaters 200, 201, 202, and 203 control the temperature-rise speeds in the respective heating regions so that the temperature-rise speeds are uniformly performed in the respective heating regions.

When each of the temperatures of the first, the second, the third, and the fourth heating regions reaches the temperature setting value within an acceptable error range, the substrates 103 are heated and annealed to temperatures corresponding to the relevant temperature setting values for 10 to 20 minutes. The heat treatment process is a cleaning process for removing an alien substance layer, such as an oxide film on the substrate 103. Here, the inside of the reaction chamber 100 becomes a hydrogen gas atmosphere.

When the heat treatment process is finished, a process of depositing a GaN buffer layer is performed. The process of depositing the GaN buffer layer is a process of depositing a GaN layer having a thickness of about 100 nm at 450° C. to 600° C. For the heat treatment process, a temperature in each heating region whose temperature has risen must be decreased to 450° C. to 600° C. The temperature at this time becomes a second temperature setting value.

Accordingly, when the main controller 230 transfer the second temperature setting values to the first, the second, the third, and the fourth individual controllers 220, 221, 222, and 223, the individual controllers 220, 221, 222, and 223 control the first, the second, the third, and the fourth heater 200, 201, 202, and 203, respectively, so that the temperatures are decreased to the second temperature setting values. The first, the second, the third, and the fourth temperature detection sensors 240, 241, 242, and 243 continue to detect the temperature-fall states and transfer the detected temperatures to the first, the second, the third, and the fourth individual controllers 220, 221, 222, and 223. Furthermore, the main controller 230 checks a temperature ramping tendency received from the first individual controller 220 and performs control so that the second, the third, and the fourth heaters 201, 202, and 203 are operated according to the checked temperature ramping tendency and thus the temperature falls of the first, the second, the third, and the fourth heating regions have the same temperature ramping tendency.

If the buffer layer is grown to a thickness of about 100 nm, an undoped GaN layer is deposited. The undoped GaN layer is deposited to a temperature of 1000° C. to 1100° C. for about 60 minutes.

To this end, temperatures are raised again. Furthermore, a process is performed in the state in which the temperature rises have the same temperature ramping tendency in the heating regions as described above. Furthermore, a process of depositing an active layer and a p-GaN layer is performed while performing temperature ramping. In this case, the heating regions have the same temperature ramping tendency. If the same temperature ramping tendency is maintained in the layers as described above, there is an advantage in that the layers deposited using the epitaxial process have a very uniform crystalline growth quality in the substrates 103 of all the susceptors 102.

Furthermore, the temperature ramping tendency may be a temperature ramping speed (i.e., a temperature-rise speed or a temperature-fall speed) or a temperature variation for a temperature setting value. If the temperature ramping speed and the temperature variation is controlled identically or similarly, the epitaxial process can be performed with higher efficiency.

Figure 6:
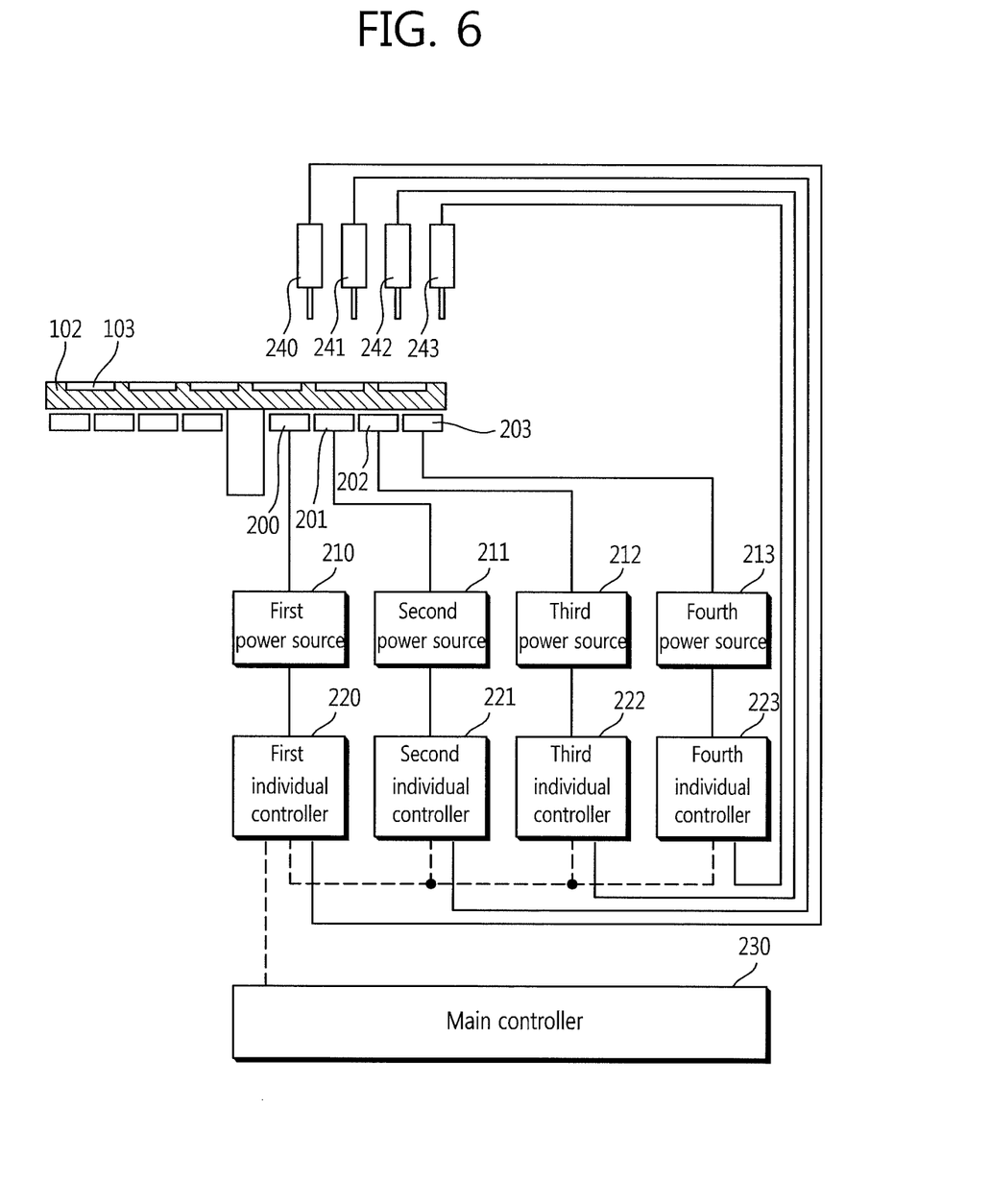
FIG. 6 is a diagram showing a second embodiment of the temperature control construction of the metal organic chemical vapor deposition device.
Figure 7:
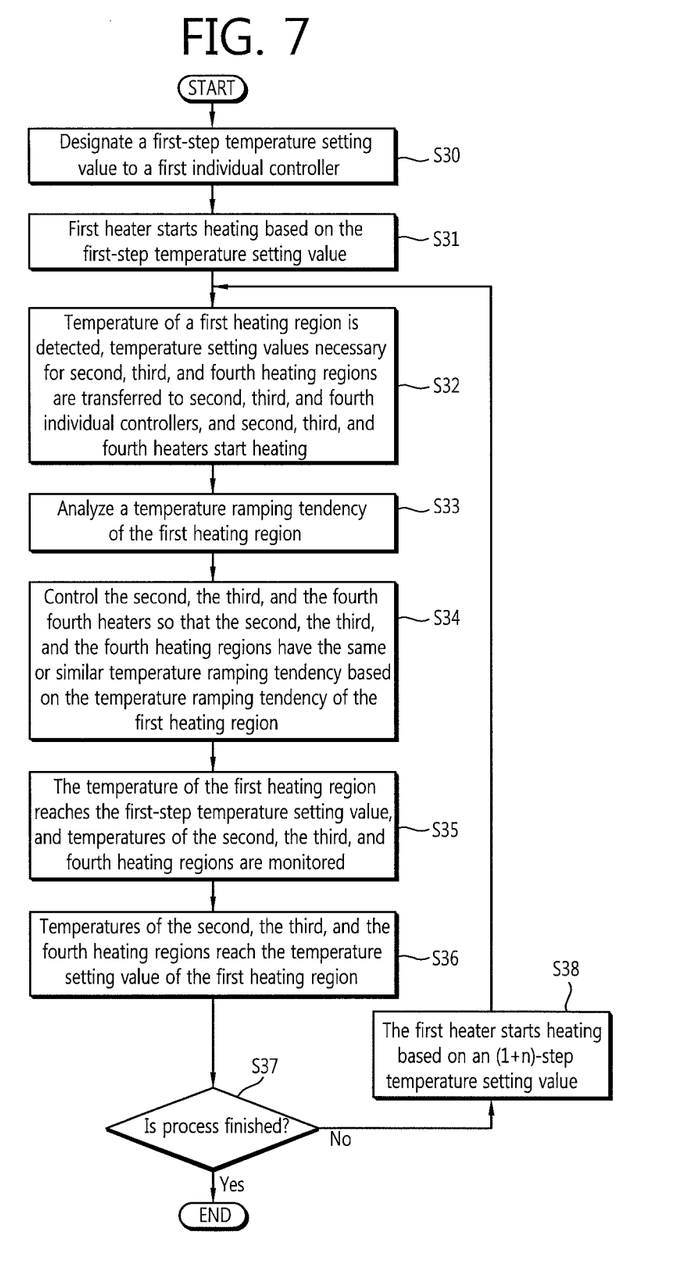
FIG. 7 is a flowchart illustrating a control method using the temperature control construction of the metal organic chemical vapor deposition device according to the embodiment of FIG. 6.

Meanwhile, in the metal organic chemical vapor deposition device of the present embodiment, the temperature control construction may be modified and implemented differently. FIG. 6 is a diagram showing a second embodiment of the temperature control construction of the metal organic chemical vapor deposition device, and FIG. 7 is a flowchart illustrating control method using the temperature control construction of the metal organic chemical vapor deposition device according to the embodiment of FIG. 6.

In the temperature control construction according to the second embodiment, as shown in FIG. 6, a first power source 210 for supplying electric power to the first heater 200 is connected to the first heater 200. The first power source 210 is equipped with a first individual controller 220 for controlling the first power source 210. Furthermore, a second power source 211 for supplying electric power to the second heater 201 is connected to the second heater 201. The second power source 211 is equipped with a second individual controller 221 for controlling the second power source 211. Furthermore, a third power source 212 for supplying electric power to the third heater 202 is connected to the third heater 202. The third power source 212 is equipped with a third individual controller 222 for controlling the third power source 212. Furthermore, a fourth power source 213 for supplying electric power to the fourth heater 203 is connected to the fourth heater 203. The fourth power source 213 is equipped with a fourth individual controller 223 for controlling the fourth power source 213. Furthermore, a main controller 230 for controlling the first individual controller 220 is provided.

Furthermore, unlike in the first embodiment, the main controller 230 is connected to the first individual controller 220, and it supplies a temperature setting value to only the first individual controller 220. That is, the main controller 230 supplies a representative temperature setting value to the first individual controller 220, but does not supply additional temperature setting values to the remaining individual controllers 221, 222, and 223. Furthermore, while the susceptors 102 are rotated by one or more times, the individual controllers 220, 221, 222, and 223 calculate the mean values of respective detected temperatures and determine the mean values as detected temperature values. Meanwhile, temperature control may be performed by using the temperature mean values and temperature values detected at specific positions.

Furthermore, temperatures detected by the temperature detection sensors 240, 241, 242, and 243 may be temperatures of the susceptors 102, may be temperatures of the substrates 103 (i.e., wafers), or may be temperatures of both the substrates 103 and the wafers which are detected while the susceptors 102 are rotated.

FIG. 7 is a flowchart illustrating a first control method using the temperature control construction of the metal organic chemical vapor deposition device according to the embodiment of FIG. 6.

As shown in FIG. 7, a representative temperature setting value (i.e., a first-step temperature setting value) may be designated to the first individual controller 220 (S30). The representative temperature setting value may be a ramping temperature that is a target in each region. After the first-step representative temperature setting value is designated to the first individual controller 220, the first temperature detection sensor 240, 241, 242, and 243 detects a temperature of the first heating region and transfers the detected temperature value to the first individual controller 220 (S31).

That is, the first heating region becomes a representative heating region. Furthermore, the first individual controller 220 transfers the temperature of the first heating region to the second, the third, and the fourth individual controllers 221, 222, and 223. Accordingly, the second, the third, and the fourth individual controllers 221, 222, and 223 start heating based on the detected temperature of the first heating region (S32). At this time, the susceptors 102 are rotated at a specific rotating speed.

Furthermore, while temperatures are ramped on the representative temperature setting value, the first temperature detection sensor 240 analyzes and determines a temperature ramping tendency (i.e., a temperature-rise tendency or a temperature-fall tendency) of the first heating region (S33). Next, the second, the third, and the fourth heaters 201, 202, and 203 are controlled so that respective temperature tendencies become adjusted (S34).

In the state in which the first, the second, the third, and the fourth heating regions have been adjusted to have the same or similar temperature ramping tendency as described above, a desired epitaxial process is performed based on the temperatures of the first, the second, the third, and the fourth heating regions (S35).

Next, if the first individual controller 220 determines that the temperatures have been ramped on the first-step representative temperature setting value, the first individual controller 220 controls the first heater 200 so that the ramped temperature is maintained. At this time, the second, the third, and the fourth individual controllers 221, 222, and 223 continue to control the respective heaters 200, 201, 202, and 203 based on a temperature value detected by the first temperature detection sensor 240, 241, 242, and 243 in real time and reported to the first individual controller 220 so that temperatures of the respective heating regions are controlled within an acceptable error range identical with or similar to the temperature of the first heating region (S33, S34). Next, whether a next process will be performed is determined (S37). If, as a result of the determination, the next process needs to be performed, the process is performed when the first heater 200 starts heating at an (1+n)-step (n is a natural number) temperature setting value (S38).

Meanwhile, in a second embodiment, the second, the third, and the fourth heaters 201, 202, and 203 are controlled so that they track the temperature of the first heating region. Accordingly, the first, the second, the third, and the fourth heaters 220, 221, 222, and 223 may automatically maintain the same or similar temperature ramping tendency with a time lag without additional control. Furthermore, even though a next process is performed, a temperature ramping tendency and temperature uniformity can be secured because ramping conditions of the first heater 200 are different from those of the second, the third, and the fourth heaters 201, 202, and 203.

Furthermore, if a temperature value of the first heating region provided from the first individual controller 220 to the second, the third, and the fourth individual controllers 221, 222, and 223 is consistently provided at short time intervals if possible, temperature uniformity and a temperature ramping tendency may be controlled more accurately.

According to the metal organic chemical vapor deposition device and the temperature control methods therefor according to the present invention, in the metal organic chemical vapor deposition device on which processes are performed while a temperature is changed from normal temperature to 1200° C., temperature conditions necessary for the epitaxial process are effectively controlled so that temperature ramping necessary during the process is uniformly performed in all the substrates. Accordingly, there are advantages in that deposition uniformity and process efficiency can be improved.

What is claimed is:

1. A metal organic chemical vapor deposition device, comprising:
   a chamber;
   susceptors rotatably installed within the chamber and configured to have at least one substrate seated therein;
   a plurality of heaters configured to heat the susceptors and to have their temperatures independently controlled;
   gas sprayers placed over the susceptors and configured to spray group III gas and group V gas toward the susceptors;
   a plurality of temperature detection sensors placed on one side of the susceptors and configured to measure temperatures of heating regions heated by the respective heaters; and
   a controller configured to control the temperatures of the heating regions considering detected temperature values, detected by the respective temperature detection sensors;
   wherein the temperature controller comprises individual controllers for controlling the respective heating regions and stores a temperature setting value for one of the heating regions as a representative temperature setting value;
   wherein the temperature controller controls a temperature of a representative heating region, selected from among the heating regions, based on the representative temperature setting value and controls the temperatures of the remaining heating regions other than the representative heating region based on the detected temperature value detected by a temperature detection sensor for detecting the temperature of the representative heating region, from among the temperature detection sensors; and
   wherein the temperature controller measures a temperature ramping tendency detected at the representative heating region and performs control so that the remaining heating regions other than the representative heating region comply with the temperature ramping tendency of the representative heating region.

2. The metal organic chemical vapor deposition device as claimed in claim 1, wherein:
   the heating regions comprise individual heaters individually controlled,
   the temperature controller comprises individual controllers for controlling the respective heaters, and
   individual power sources for independently supplying electric power to the respective heaters are connected to the respective heaters.

3. The metal organic chemical vapor deposition device as claimed in claim 1, wherein the temperature ramping tendency is a temperature ramping speed of the representative heating region.

4. The metal organic chemical vapor deposition device as claimed in claim 1, wherein the temperature controller calculates a mean value of temperatures detected while the susceptors are rotated by specific number of times, and controls the temperatures of the heating regions by comparing the mean value with each of the temperature setting values.

5. The metal organic chemical vapor deposition device as claimed in claim 4, wherein the temperatures of the heating regions detected by the temperature detection sensors are temperatures for the susceptors.

6. The metal organic chemical vapor deposition device as claimed in claim 4, wherein the temperatures of the heating regions detected by the temperature detection sensors are a temperature for the substrate.

7. The metal organic chemical vapor deposition device as claimed in claim 4, wherein the temperatures of the heating regions detected by the temperature detection sensors are temperatures for the susceptors and the substrate.

8. A method of controlling temperatures of a plurality of heating regions for a metal organic chemical vapor deposition device, the method comprising:
   detecting the temperatures of the heating regions by using respective temperature detection sensors; and
   comparing temperature values, detected by the temperature detection sensors, with respective temperature setting values and controlling the heating regions based on the temperature setting values by using a temperature controller for storing the temperature setting values necessary for the respective heating regions;

wherein the temperature controller comprises individual controllers for controlling the respective heating regions, stores a temperature setting value for any one of the heating regions, a representative heating region, as a representative temperature setting value, and controls the temperatures of the heating regions based on the representative temperature setting value; and wherein the temperature controller measures a temperature ramping tendency detected at the representative heating region and performs control so that the remaining heating regions other than the representative heating region comply with the temperature ramping tendency of the representative heating region.

9. The method as claimed in claim 8, wherein:

the heating regions comprise individual heaters individually controlled, the temperature controller comprises individual controllers for controlling the respective heaters, and individual power sources for independently supplying electric power to the respective heaters are connected to the respective heaters.

10. The method as claimed in claim 8, wherein the temperature ramping tendency is a tilt of a change of temperature of the representative heating region per time.

11. The method as claimed in claim 8, wherein the temperature controller stores individual temperature setting values necessary for the respective heating regions and controls the temperatures of the respective heating regions using the individual temperature setting values.

12. The method as claimed in claim 11, wherein the temperature controller measures a temperature ramping tendency detected in each of the heating regions and performs control so that the heating regions have the temperature ramping tendency.

13. The method as claimed in claim 12, wherein the temperature ramping tendency is a tilt of a change of temperature of the representative heating region per time.

14. The method as claimed in claim 12, wherein the temperature ramping tendency is a temperature variation in each of the temperature setting values of the heating regions.

15. The method as claimed in claim 8, wherein the temperature controller calculates a mean value of temperatures detected while the susceptors are rotated by specific number of times, and controls the temperatures of the heating regions by comparing the mean value with each of the temperature setting values.

16. The method as claimed in claim 15, wherein the temperatures of the heating regions detected by the temperature detection sensors are temperatures for the susceptors.

17. The method as claimed in claim 15, wherein the temperatures of the heating regions detected by the temperature detection sensors are a temperature for the substrate.

18. The method as claimed in claim 15, wherein the temperatures of the heating regions detected by the temperature detection sensors are temperatures for the susceptors and the substrate.

* * * * *